United States Patent
Kumar et al.

(10) Patent No.: US 9,300,275 B1
(45) Date of Patent: Mar. 29, 2016

(54) MULTI-BIT PULSED LATCH CELL FOR USE IN AN INTEGRATED CIRCUIT

(71) Applicant: Cirrus Logic, Inc., Austin, TX (US)

(72) Inventors: Bhoodev Kumar, Austin, TX (US); Saurabh Singh, Cedar Park, TX (US); Lei Zhu, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 69 days.

(21) Appl. No.: 14/339,879

(22) Filed: Jul. 24, 2014

Related U.S. Application Data (60) Provisional application No. 61/858,464, filed on Jul. 25, 2013.

(51) Int. Cl.
*H03K 3/00* (2006.01)
*H03K 3/012* (2006.01)
*G06F 17/50* (2006.01)

(52) U.S. Cl.
CPC .............. *H03K 3/012* (2013.01); *G06F 17/505* (2013.01)

(58) Field of Classification Search
USPC .................................................. 327/199–206
See application file for complete search history.

(56) References Cited

U.S. PATENT DOCUMENTS

| | | | | |
|---|---|---|---|---|
| 2003/0034795 A1* | 2/2003 | Otto | ............... | G01R 31/318541 326/16 |
| 2004/0041610 A1* | 3/2004 | Kundu | ........... | G01R 31/318541 327/215 |
| 2005/0268191 A1* | 12/2005 | Shin | ............... | G01R 31/318541 714/726 |
| 2009/0237136 A1* | 9/2009 | Kim | ................. | H03K 3/356104 327/210 |
| 2010/0308864 A1* | 12/2010 | Lee | .................. | H03K 3/356191 326/46 |
| 2011/0231723 A1* | 9/2011 | Lee | .......................... | G06F 11/24 714/731 |
| 2012/0249204 A1* | 10/2012 | Nishioka | .......... | G01R 31/31726 327/202 |
| 2013/0328601 A1* | 12/2013 | Geisler | ............ | H03K 3/356113 327/142 |
| 2014/0258798 A1* | 9/2014 | Ahmed | .......... | G01R 31/318547 714/727 |
| 2015/0113345 A1* | 4/2015 | Chen | .............. | G01R 31/318541 714/727 |
| 2015/0248515 A1* | 9/2015 | Lin | ...................... | G06F 17/5045 716/136 |

* cited by examiner

*Primary Examiner* — Adam Houston
(74) *Attorney, Agent, or Firm* — Jackson Walker L.L.P.

(57) ABSTRACT

In accordance with embodiments of the present disclosure, a multi-bit pulsed latch circuit for an integrated circuit design system may include a pulse generator and a plurality of latches. The pulse generator may be configured to generate pulses. The plurality of latches may operate as storage elements and are coupled to the pulse generator in a manner so that the multi-bit pulsed latch circuit provides functionality of at least two flip flop elements, wherein the multi-bit pulsed latch circuit can replace the at least two flip flop elements that normally would be used by the integrated circuit design system.

41 Claims, 4 Drawing Sheets

MULTI-BIT PULSED LATCH CELL FOR USE IN AN INTEGRATED CIRCUIT

RELATED APPLICATION

The present disclosure claims priority to U.S. Provisional Patent Application Ser. No. 61/858,464, filed Jul. 25, 2013, which is incorporated by reference herein in its entirety.

FIELD OF DISCLOSURE

The present disclosure relates in general to the field of electronics, and more specifically to systems and methods for providing a multi-bit latched cell for use in an integrated circuit.

BACKGROUND

Figure 1:
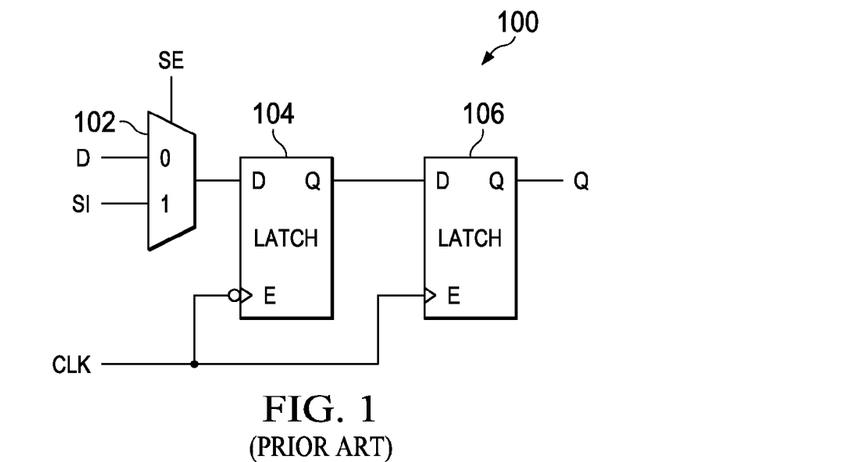
FIG. 1 illustrates a block diagram of a standard flip flop, as is known in the art.

A flip flop is a very common and well-known element in the field of electronics and integrated circuits. A common use and functionality for a flip flop is to store a single bit value, and thus a flip flop is a single bit storage element. FIG. 1 illustrates a standard flip flop 100, as is known in the art. Standard flip flop 100 may comprise two latches 104 and 106. Latches 104 and 106 each have inputs D and outputs Q and are coupled in series with an inversion in the level sensitivity through inputs E to provide single-bit storage. A scan multiplexer 102 may be coupled to an input D of each of multiple flip flops 100 in an integrated circuit so that the various flip flops 100 within the integrated circuit design may be scan testable. Scan multiplexer 102 may receive control signal SE and may have data inputs D and SI.

Figure 2:
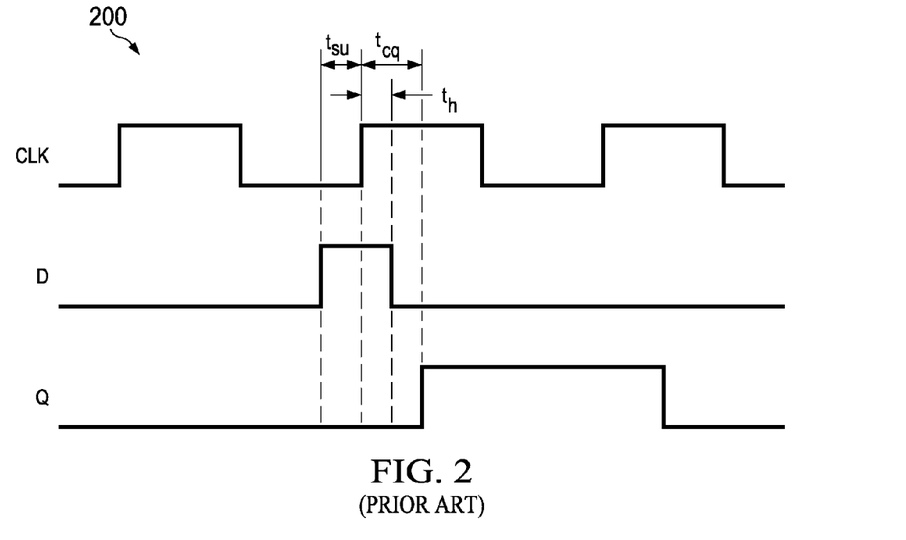
FIG. 2 illustrates an example timing diagram for a standard flip flop, as is known in the art.

FIG. 2 illustrates an example timing diagram 200 for standard flip flop 100, as is known in the art. Timing diagram 200 shows an example input signal for input D and an example output signal for output Q for flip flop 100 timed in accordance with a clock signal CLK received at inputs E of latches 104 and 106. Timing diagram 200 for flip flop 100 further illustrates an example set-up time $t_{su}$, an example hold time $t_h$, and an example clock-to-output time $t_{cq}$. A set-up time $t_{su}$ may define a minimum amount of time a data signal on input D of flip flop 100 should be held steady before a clock event (e.g., rising edge of clock signal CLK) so that data is reliably sampled by flip flop 100. A hold time $t_h$ may define a minimum amount of time a data signal should be held steady after the clock event (e.g., rising edge of clock signal CLK) so that the data is reliably sampled by flip flop 100. A clock-to-output time $t_{cq}$ (also sometimes referred to as a clock-to-output delay or propagation delay) may define a time in which flip flop 100 takes to change an output signal on output Q after the clock event (e.g., rising edge of clock signal CLK).

As with any circuit element, standard flip flop 100 may take up area within an integrated circuit and consume power in operation. In most integrated circuit designs, it is often desirable to reduce area and power consumption of integrated circuit components, including standard flip flops. In addition, it is often desirable to minimize the various timing parameters of a flip flop of a storage element, including set-up time $t_{su}$, hold time $t_h$, and clock-to-output time $t_{cq}$

SUMMARY

In accordance with the teachings of the present disclosure, certain disadvantages and problems associated with traditional approaches to storing data in an integrated circuit may be reduced or eliminated.

In accordance with embodiments of the present disclosure, a multi-bit pulsed latch circuit for an integrated circuit design system may include a pulse generator and a plurality of latches. The pulse generator may be configured to generate pulses. The plurality of latches may operate as storage elements and are coupled to the pulse generator in a manner so that the multi-bit pulsed latch circuit provides functionality of at least two flip flop elements, wherein the multi-bit pulsed latch circuit can replace the at least two flip flop elements that normally would be used by the integrated circuit design system.

In accordance with these and other embodiments of the present disclosure, a method of implementing a multi-bit pulsed latch circuit for an integrated circuit design system may include, within the multi-bit pulsed latch circuit, generating pulses by a pulse generator and coupling a plurality of latches that operate as storage elements to the pulse generator in a manner so that the multi-bit pulsed latch circuit provides functionality of at least two flip flop elements and can replace the at least two flip flop elements that normally would be used by the integrated circuit design system.

In accordance with these and other embodiments of the present disclosure, a computer program product for implementing a multi-bit pulsed latch circuit for an integrated circuit design system may include a computer usable medium having computer readable code physically embodied therein, said computer program product further comprising computer readable program code for, within the multi-bit pulsed latch circuit, generating pulses by a pulse generator and coupling a plurality of latches that operate as storage elements to the pulse generator in a manner so that the multi-bit pulsed latch circuit provides functionality of at least two flip flop elements and can replace the multi-bit pulsed latch circuit with the at least two flip flop elements that normally would be used by the integrated circuit design system.

In accordance with these and other embodiments of the present disclosure, an integrated circuit design system for synthesizing an integrated circuit design, may include a processor and a memory device coupled to the processor. The memory device may store a plurality of instructions that when executed by the processor provides at least one software module that includes a logic synthesizer module that receives a circuit description and a cell technology file to generate functional logic of the integrated circuit design, wherein the cell technology file includes a characterization of a multi-bit pulsed latch circuit that functions as at least two flip flops and that includes a pulse generator for generating pulses and a plurality of latches coupled to the pulse generator and wherein the logic synthesizer module generates the functional logic of the integrated circuit so that the multi-bit pulsed latch circuit can be used in place of the at least two flip flops that are in data paths of the circuit description.

In accordance with these and other embodiments of the present disclosure, a method for synthesizing an integrated circuit design may include storing in a memory device a plurality of instructions. The method may also include executing, by a processor, the plurality of instructions to provide at least one software module that includes a logic synthesizer module. The method may additionally include receiving, by the logic synthesizer module, a circuit description and a cell technology file and generating, by the logic synthesizer module, functional logic of the integrated circuit design. The method may further include characterizing, within the cell technology file, a multi-bit pulsed latch circuit that functions as at least two flip flops and that includes a pulse generator for generating pulses and a plurality of latches coupled to the pulse generator. In addition, the method may include generating, by the logic synthesizer module, the functional logic of the integrated circuit so that the multi-bit pulsed latch circuit can be used in place of the at least two flip flops that are in data paths of the circuit description.

In accordance with these and other embodiments of the present disclosure, a computer program product for synthesizing an integrated circuit design may include a computer usable medium having computer readable code physically embodied therein, wherein the computer program product further comprises computer readable program code for: (i) storing in a memory device a plurality of instructions; (ii) executing, by a processor, the plurality of instructions to provide at least one software module that includes a logic synthesizer module; (iii) receiving, by the logic synthesizer module, a circuit description and a cell technology file; (iv) generating, by the logic synthesizer module, functional logic of the integrated circuit design; (v) characterizing, within the cell technology file, a multi-bit pulsed latch circuit that functions as at least two flip flops and that includes a pulse generator for generating pulses and a plurality of latches coupled to the pulse generator; and (vi) generating, by the logic synthesizer module, the functional logic of the integrated circuit so that the multi-bit pulsed latch circuit can be used in place of the at least two flip flops that are in data paths of the circuit description.

Technical advantages of the present disclosure may be readily apparent to one of ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

DETAILED DESCRIPTION

A multi-bit pulsed latch cell for an integrated circuit design and an integrated circuit design system is provided. The multi-bit pulsed latch cell includes a pulse generator for generating pulses and a plurality of latches that operate as storage elements. The plurality of latches is coupled to the pulse generator in a manner so that the multi-bit pulsed latch cell in accordance with the present disclosure provides functionality of at least two or more flip flop elements. The multi-bit pulsed latch cell can replace at least two or more flip flop elements that normally would be used and implemented by the integrated circuit design system. The multi-bit pulsed latch cell generally saves area and power for an integrated circuit design relative to the two or more flip flops that it replaces. Also, instead of merely being able to store and provide a single bit value as in the case of a flip flop, the multi-bit pulsed latch cell can store and provide a multi-bit value or multiple bits of values.

Figure 3:
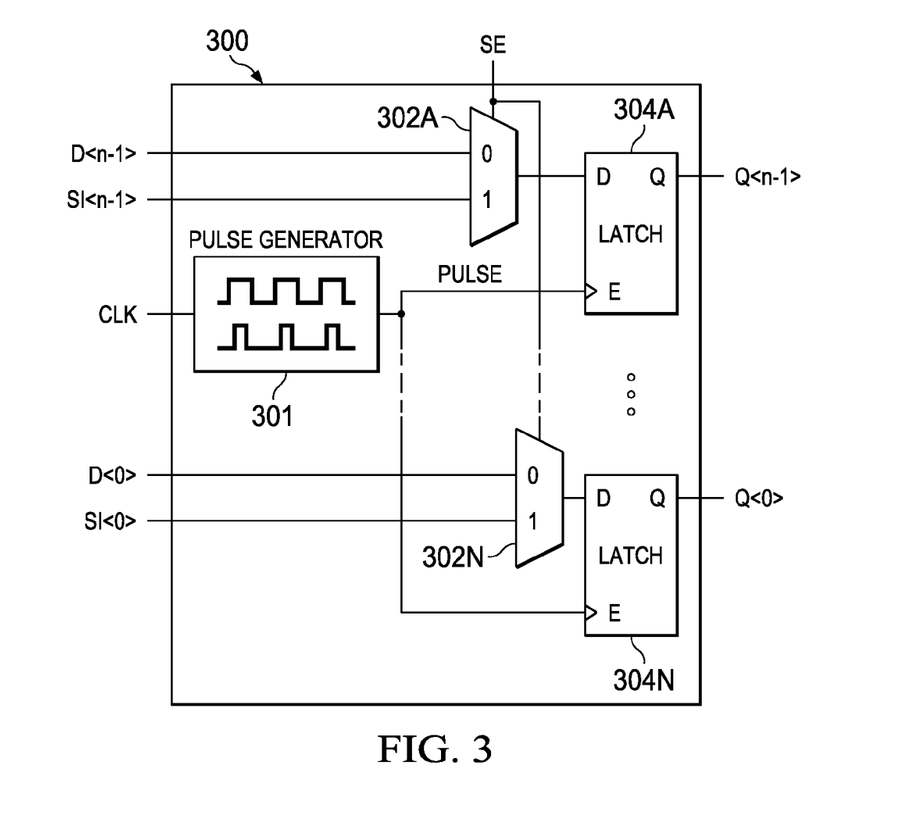
FIG. 3 illustrates a block diagram of an example multi-bit pulsed latch cell for an integrated circuit and integrated circuit design system, in accordance with embodiments of the present disclosure.

FIG. 3 illustrates a block diagram of an example multi-bit pulsed latch cell 300 for an integrated circuit and integrated circuit design system, in accordance with embodiments of the present disclosure. As shown in FIG. 3, multi-bit pulsed latch cell 300 may include a pulse generator 301, a plurality of scan multiplexers 302 (e.g., scan multiplexers 302A through 302N), and a plurality of latches (e.g., latches 304A through 304N). Pulse generator 301 may receive a clock signal CLK as an input, and based thereon, output a clock pulse signal PULSE. Each latch 304 may comprise a data input D, an inverter input E, and an output Q.

Pulse generator 301 may be shared among the plurality of latches 304, such that pulse generator may provide clock pulse signal PULSE to inverter inputs E of latches 304. Latches 304 may be coupled to pulse generator 301 in a manner such that multi-bit pulsed latch cell 300 provides functionality of at least two or more flip flop elements, such as two or more flip flops 100. Each latch 304 may provide the functionality of a flip flop that would otherwise require two latches to implement, thus reducing area and power consumption when compared to a standard flip flop 100.

Each scan multiplexer 302 may include a data input D (e.g., D<0> through D<N−1>) and a scan information input S (e.g., SI<0> through SI<n−1>), and may include a scan enable control input SE for receiving a scan enable signal, which may be shared by multiple scan multiplexers 302. Scan multiplexers 302A through 302N may be respectively coupled to the data inputs D of latches 304A through 304N such that the various latches 304 within multi-bit pulsed latch cell 300 are scan testable.

Figure 4:
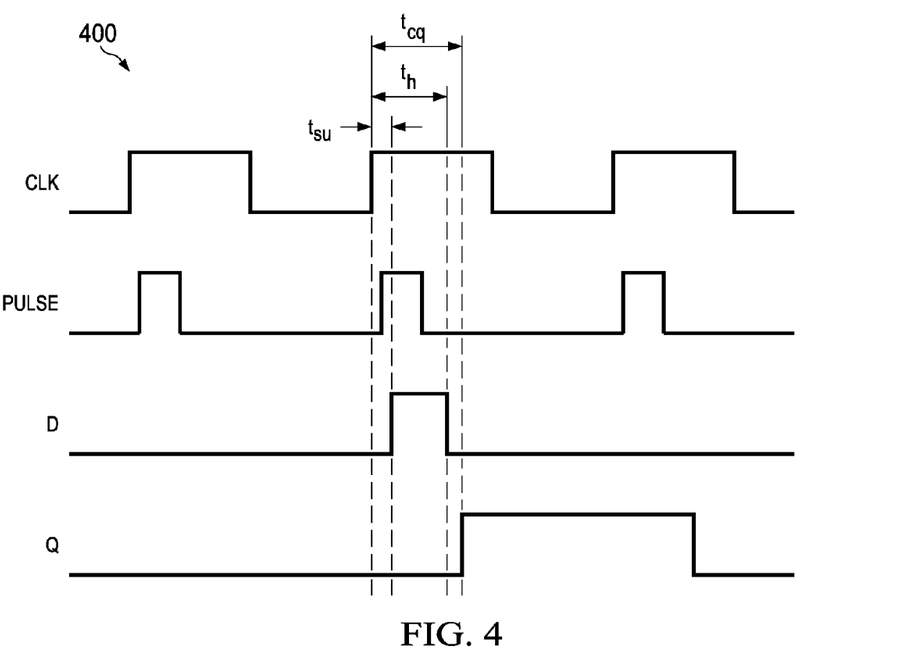
FIG. 4 illustrates an example timing diagram for a multi-pulsed latch cell, in accordance with embodiments of the present disclosure.

FIG. 4 illustrates an example timing diagram 400 for multi-bit pulsed latch cell 300, in accordance with embodiments of the present disclosure. Timing diagram 400 depicts an example input signal for an input D of multi-bit pulsed latch cell 300 and an example output signal for an output Q of multi-bit pulsed latch cell 300 timed in accordance with clock signal CLK and clock pulse signal PULSE output by pulse generator 301. Timing diagram 400 for multi-bit pulsed latch cell 300 further illustrates an example set-up time $t_{su}$, an example hold time $t_h$, and an example clock-to-output time $t_{cq}$. The set-up time $t_{su}$, hold time $t_h$, and clock-to-output time $t_{cq}$ for defining multi-bit pulsed latch cell 300 may be different than the set-up time $t_{su}$, hold time $t_h$, and clock-to-output time $t_{cq}$ for defining standard flip flop 100, and in some cases may be smaller than such timing factors for defining standard flip flop 100, such that multi-bit pulsed latch cell 300 may support faster operation than that of standard flip flop 100.

Figure 5:
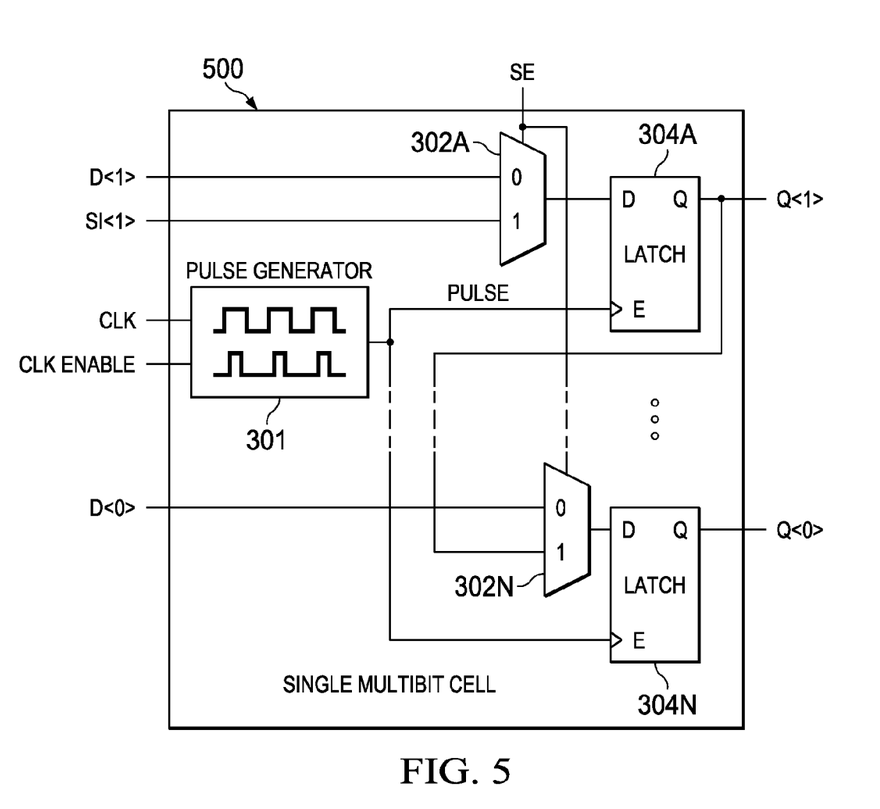
FIG. 5 illustrates a block diagram of another example multi-bit pulsed latch cell for an integrated circuit and integrated circuit design system, in accordance with embodiments of the present disclosure.

FIG. 5 illustrates a block diagram of another example multi-bit pulsed latch cell 500 for an integrated circuit and integrated circuit design system, in accordance with embodiments of the present disclosure. As shown in FIG. 5, multi-bit pulsed latch cell 500 may have many of the same elements as and may be similar to multi-bit pulsed latch cell 300, so only the differences between them will be discussed. Instead of scan multiplexer 302N receiving at its scan input (labeled "1") a control input signal S<O>, the output signal Q<1> from output Q of latch 304A may be fed back to the scan input of scan multiplexer 302N. The scan input of scan multiplexer 302N may be coupled to the output Q of latch 304A either within multi-bit pulsed latch cell 500 or outside of multi-bit pulsed latch cell 500. In this way, a scan chain for latches 304A through 304N may be stitched within multi-bit pulsed latch cell 500, and such scan stitching within multi-bit pulsed latch cell 500 may further save power and area for the integrated circuit design. Furthermore, if the multi-bit pulsed latch cell 500 is not being used to provide flip flop functionality for the integrated circuit design, a CLK ENABLE signal fed to pulse generator 301 may be used to disable the clock locally without having to use additional buffers outside of multi-bit pulsed latch cell 500. Thus, multi-bit pulsed latch cell 500 may provide clock gating without having to provide additional buffers outside of multi-bit pulsed latch cell 500 and within the integrated circuit design.

Figure 6:
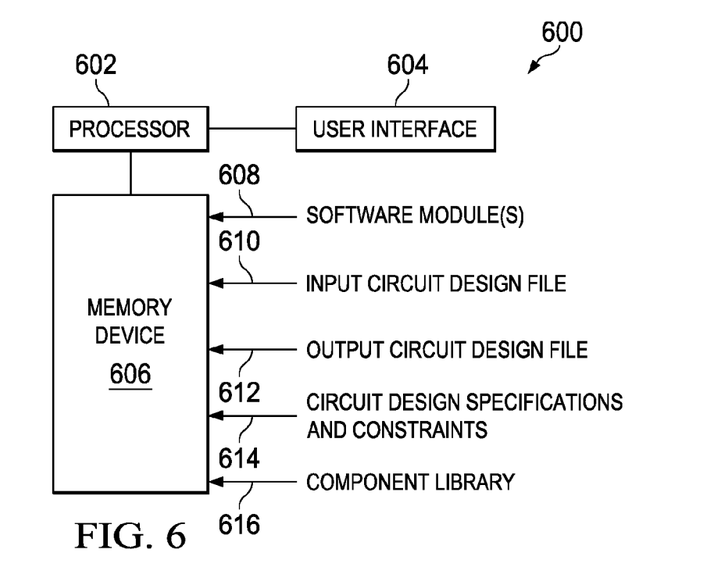
FIG. 6 illustrates a block diagram of an example circuit design system, in accordance with embodiments of the present disclosure.

FIG. 6 illustrates a block diagram of an example circuit design system 600, in accordance with embodiments of the present disclosure. Circuit design system 600 may be capable of receiving and synthesizing, analyzing, and/or optimizing an initial circuit design that includes multi-bit pulsed latches 300 and/or multi-bit pulsed latches 500. Circuit design system 600 may comprise any computing device, such as a computer that has a processor 602, a user interface 604, and a memory device 606.

Processor 602 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 602 may interpret and/or execute program instructions and/or process data stored in memory device 606 and/or another component of circuit design system 600.

Memory device 606 may be communicatively coupled to processor 602 and may include any system, device, or apparatus configured to retain program instructions and/or data for a period of time (e.g., computer-readable media). Memory device 606 may include random access memory (RAM), read-only memory (ROM), electrically erasable programmable read-only memory (EEPROM), flash memory, magnetic storage, opto-magnetic storage, or any suitable selection and/or array of volatile or non-volatile memory that retains data after power to circuit design system 600 is turned off. Memory device 606 may store different types of instructions and/or data, including, but not limited to software module(s) 608 including executable instructions that may be executed by processor 602 (e.g., circuit design synthesis, analysis and/ or optimization tools) to control processor 602 in performing its various operations, an input circuit design file 610, an output circuit design file 612, circuit design specifications and constraints 614, a component library 616, and/or other data, information, or instructions. One or more of input circuit design file 610, circuit design specifications and constraints 614, and component library 616 may include data and information for defining multi-bit pulsed latch cell 300 and/or multi-bit pulsed latch cell 500.

User interface 604 may comprise any instrumentality or aggregation of instrumentalities by which a user may interact with circuit design system 600. For example, user interface 604 may permit a user to input data and/or instructions into circuit design system 600, and/or otherwise manipulate circuit design system 600 and its associated components (e.g., via keyboard, mouse, trackpad, or other pointing device). User interface 604 may also permit circuit design system 600 to communicate data to a user, e.g., by way of a display device.

Figure 7:
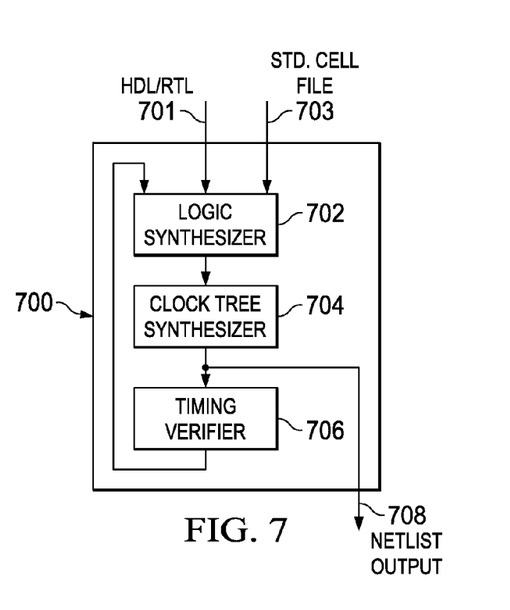
FIG. 7 illustrates a block diagram of a synthesis software tool, in accordance with embodiments of the present disclosure.

FIG. 7 illustrates a block diagram of a synthesis software tool 700, in accordance with embodiments of the present disclosure. Synthesis software tool 700 may be stored as computer-readable instructions in memory device 606 and readable and executable by the processor 602 of circuit design system 600. Synthesis software tool 700 may comprise a logic synthesizer module 702, a clock tree synthesizer module 704, and a timing verifier 706. Logic synthesizer module 702 may receive a high-level description language (HDL) or register transfer level (RTL) circuit description 701 and a standard cell technology file 703. Functional logic may be generated from standard cell technology file 703 by logic synthesizer module 702, including the various multi-bit pulsed latch cells 300 and/or multi-bit pulsed latch cells 500, so that the multi-bit pulsed latch cells 300 and/or multi-bit pulsed latch cells 500 may each be respectively used in place of at least two flip flops (e.g., flip flops 100) that are in the data paths of the circuit description 701 in data paths of an integrated circuit. Standard cell technology file 703 may include data and information for characterizing multi-bit pulsed latch cell 300 and/or multi-bit pulsed latch cell 500 as one or more standard cell wherein multi-bit pulsed latch cell 300 or multi-bit pulsed latch cell 500 functions as at least two flip flops (e.g., at least two standard flip flops 100). Clock tree synthesizer module 704 may generate clock tree paths in the integrated circuit from a clock source to the clock inputs of the various elements including the various multi-bit pulsed latch cells 300 and/or multi-bit pulsed latch cells 500 in the data paths. The timing verifier module 706 may receive a netlist including data paths and clock tree paths of the integrated circuit design to verify that timing specifications are satisfied with the given logical design of the integrated circuit. Timing verifier module 706 may verify that the timing specifications of the logical design are in fact met to output a netlist 708. Netlist 708 may be sent to a foundry for manufacturing of the integrated circuit described by netlist 708.

Figure 8:
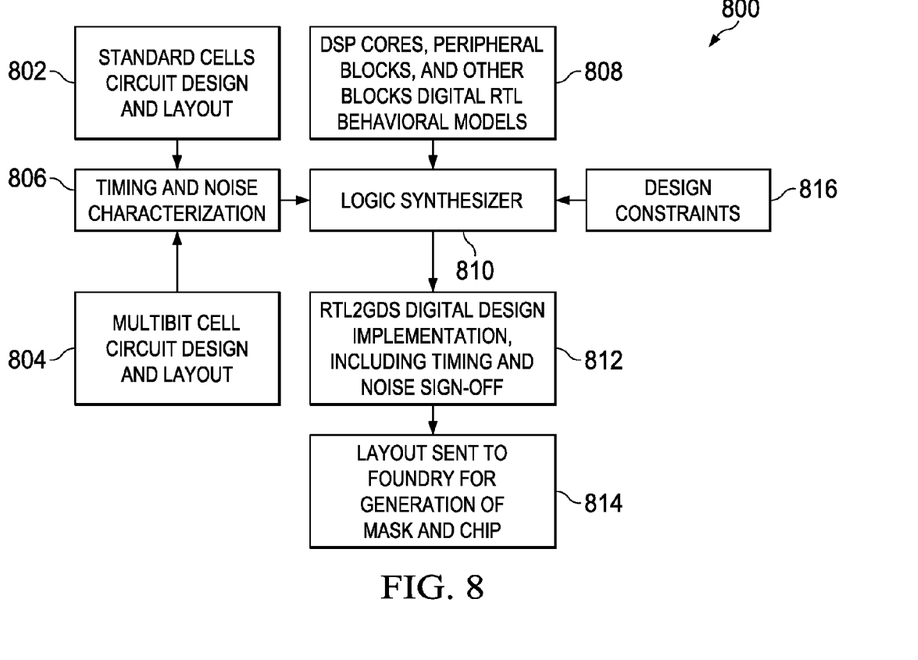
FIG. 8 illustrates a flow chart of an example method for synthesizing an integrated circuit design with multi-bit pulsed latch cells in accordance with the present disclosure.

FIG. 8 illustrates a flow chart of an example method 800 for synthesizing an integrated circuit design with multi-bit pulsed latch cells 300 and/or multi-bit pulsed latch cells 500 in accordance with the present disclosure. Method 800 may be embodied in instructions that are stored in memory device 606 of circuit design system 600 and read and executed by processor 602. For example, method 800 may be implemented by synthesis software tool 700. In accordance with method 800, at block 802, a standard cell circuit design and layout 802 for an integrated circuit design may be provided to a timing and noise characterization block 806, and at block 804, multi-bit cell circuit design and layout for the integrated circuit design that incorporate multi-bit pulsed latch cells 300 and/or multi-bit pulsed latch cells 500 in accordance with the present disclosure may also be provided to timing and noise characterization block 806. The timing and noise characterization block 806 may provide timing and noise characterizations of the integrated circuit design to logic synthesizer module 702 at logic synthesizer process block 810. Characterizations of the laid-out standard cells and the laid-out multi-bit cells (including multi-bit pulsed latch cells 300 and/ or multi-bit pulsed latch cells 500) may also be provided to logic synthesizer module 702 at logic synthesizer process block 810. The digital RTL behavioral models of block 808 may be among the RTL circuit description 701 provided to logical synthesizer processor block 810. RTL behavioral models of block 808 may include but are not limited to digital signal processing (DSP) cores, peripheral blocks, and other blocks that may be digitally designed. Furthermore, the design constraints of block 816, that may include, without limitation, set-up time $t_{su}$, hold time $t_h$, and clock-to-output time $t_{cq}$, such as shown in accordance with timing diagram 400 of FIG. 4 for multi-bit pulsed latch cell 300 and such as for multi-bit pulsed latch cell 500, and other parameters, may also be provided to logic synthesizer process block 810. Within logic synthesizer process block 810, logic synthesizer 702 synthesizes the data and information relating to the laid-out standard cells, the laid-out multi-bit cells, the timing and noise characterizations, the various digital RTL behavioral models, and the design constraints to provide a physical design layout that results in a RTL to Graphic Data System ("GDS") digital design implementation at block 812. GDS is a format that may be used to control integrated circuit photomask plotting. The RTL-to-GDS digital design implementation includes at least the timing information and noise sign-off information. The GDS file containing the physical design layout information may be sent to a foundry for generation of a mask and the semiconductor chip at block 814.

With respect to the integrated circuit design, a plurality of multi-bit pulsed latch cells 300 and/or multi-bit pulsed latch cells 500 can also be coupled together in series so that the multi-bit pulsed latch cells 300 and/or 500 are scan testable.

As used herein, when two or more elements are referred to as "coupled" to one another, such term indicates that such two or more elements are in electronic communication whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A multi-bit pulsed latch circuit for an integrated circuit design system, comprising:
    a pulse generator for generating pulses;
    a plurality of latches that operate as storage elements and are coupled to the pulse generator in a manner so that the multi-bit pulsed latch circuit provides functionality of at least two flip flop elements; and
    wherein the multi-bit pulsed latch circuit can replace the at least two flip flop elements that normally would be used by the integrated circuit design system.

2. The multi-bit pulsed latch circuit of claim 1, wherein the pulse generator is shared among the plurality of latches.

3. The multi-bit pulsed latch circuit of claim 1, wherein clock gating operations for the integrated circuit design system are performed within the multi-bit pulsed latch circuit.

4. The multi-bit pulsed latch circuit of claim 1, wherein the plurality of latches are able to be stitched together so that the latches are scan testable.

5. The multi-bit pulsed latch circuit of claim 1, further comprising an element for being able to couple to at least another multi-bit pulsed latch circuit in series so that the multi-bit pulsed latch circuit and the at least another multi-bit pulsed latch circuit are scan testable.

6. The multi-bit pulsed latch circuit of claim 1, wherein the pulse generator and the plurality of latches are capable of being defined to characterize a multi-bit pulsed cell.

7. The multi-bit pulsed latch circuit of claim 6, wherein the multi-bit pulsed cell is capable of being embodied in a cell technology file receivable by a logic synthesizer module of an integrated circuit design system for synthesizing an integrated circuit design.

8. The multi-bit pulsed latch circuit of claim 6, wherein design constraints for defining the multi-bit pulsed latch cell at least include set up, hold, and clock-to-output timing operations.

9. A method of implementing a multi-bit pulsed latch circuit for an integrated circuit design system, comprising:
    within the multi-bit pulsed latch circuit:
        generating pulses by a pulse generator; and
        coupling a plurality of latches that operate as storage elements to the pulse generator in a manner so that the multi-bit pulsed latch circuit provides functionality of at least two flip flop elements and can replace the at least two flip flop elements that normally would be used by the integrated circuit design system.

10. The method of claim 9, wherein generating pulses by a pulse generator further comprises sharing the pulse generator among the plurality of latches.

11. The method of claim 9, further comprising performing clock gating operations for the integrated circuit design system within the multi-bit pulsed latch circuit.

12. The method of claim 9, wherein coupling a plurality of latches further comprises stitching together the plurality of latches so that the latches are scan testable.

13. The method of claim 9, further comprising coupling at least another multi-bit pulsed latch circuit to the multi-bit pulsed latch circuit in series so that the multi-bit pulsed latch circuit and the at least another multi-bit pulsed latch circuit are scan testable.

14. The method of claim 9, further comprising defining the pulse generator and the plurality of latches to characterize the multi-bit pulsed latch circuit as a multi-bit pulsed latch cell for a cell technology file receivable by a logic synthesizer module of an integrated circuit design system for synthesizing an integrated circuit design.

15. The method of claim 9, further comprising defining the multi-bit pulsed latch circuit by using design constraints that at least include set up, hold, and clock-to-output timing operations.

16. A computer program product for implementing a multi-bit pulsed latch circuit for an integrated circuit design system, the computer program product comprising a computer usable medium having computer readable code physically embodied therein, said computer program product further comprising computer readable program code for, within the multi-bit pulsed latch circuit:

generating pulses by a pulse generator; and coupling a plurality of latches that operate as storage elements to the pulse generator in a manner so that the multi-bit pulsed latch circuit provides functionality of at least two flip flop elements and can replace the multi-bit pulsed latch circuit with the at least two flip flop elements that normally would be used by the integrated circuit design system.

17. The computer program product of claim 16, wherein the computer readable program code for generating pulses by a pulse generator further comprises computer readable program code for sharing the pulse generator among the plurality of latches.

18. The computer program product of claim 16, further comprising computer readable program code for defining the pulse generator and the plurality of latches to characterize the multi-bit pulsed latch circuit for a cell technology file receivable by a logic synthesizer module of an integrated circuit design system for synthesizing an integrated circuit design.

19. The computer program product of claim 16, further comprising computer readable program code for performing clock gating operations for the integrated circuit design system within the multi-bit pulsed latch circuit.

20. The computer program product of claim 16, further comprising computer readable program code for stitching together the plurality of latches so that the latches are scan testable.

21. The computer program product of claim 16, further comprising computer readable program code for coupling at least another multi-bit pulsed latch circuit to the multi-bit pulsed latch circuit in series so that the multi-bit pulsed latch circuit and the at least another multi-bit pulsed latch circuit are scan testable.

22. The computer program product of claim 16, further comprising computer readable program code for defining the pulse generator and the plurality of latches to characterize the multi-bit pulsed latch circuit as a multi-bit pulsed latch cell for a cell technology file receivable by a logic synthesizer module of an integrated circuit design system for synthesizing an integrated circuit design.

23. The computer program product of claim 16, further comprising computer readable program code for:

defining the multi-bit pulsed latch circuit by using design constraints that at least include set up, hold, and clock-to-output timing operations.

24. An integrated circuit design system for synthesizing an integrated circuit design, comprising:

a processor; and a memory device coupled to the processor, wherein the memory device stores a plurality of instructions that when executed by the processor provides at least one software module that includes:

a logic synthesizer module that receives a circuit description and a cell technology file to generate functional logic of the integrated circuit design;

wherein the cell technology file includes a characterization of a multi-bit pulsed latch circuit that functions as at least two flip flops and that includes a pulse generator for generating pulses and a plurality of latches coupled to the pulse generator; and wherein the logic synthesizer module generates the functional logic of the integrated circuit design so that the multi-bit pulsed latch circuit can be used in place of the at least two flip flops that are in data paths of the circuit description.

25. The integrated circuit design system of claim 24, wherein within the multi-bit pulsed latch circuit, the pulse generator is shared among the plurality of latches.

26. The integrated circuit design system of claim 24, wherein clock gating operations for the integrated circuit design are performed within the multi-bit pulsed latch circuit.

27. The integrated circuit design system of claim 24, wherein the plurality of latches are stitched together so that the latches are scan testable.

28. The integrated circuit design system of claim 24, wherein the cell technology file that includes the characterization of the multi-bit pulsed latch circuit further comprises characterizations of a plurality of multi-bit pulsed latch circuits.

29. The integrated circuit design system of claim 26, wherein the plurality of multi-bit pulsed latch circuits are coupled in series for scan testability.

30. A method for synthesizing an integrated circuit design, comprising: storing in a memory device a plurality of instructions;

executing, by a processor, the plurality of instructions to provide at least one software module that includes a logic synthesizer module;

receiving, by the logic synthesizer module, a circuit description and a cell technology file; generating, by the logic synthesizer module, functional logic of the integrated circuit design;

characterizing, within the cell technology file, a multi-bit pulsed latch circuit that functions as at least two flip flops and that includes a pulse generator for generating pulses and a plurality of latches coupled to the pulse generator; and generating, by the logic synthesizer module, the functional logic of the integrated circuit so that the multi-bit pulsed latch circuit can be used in place of the at least two flip flops that are in data paths of the circuit description.

31. The method of claim 30, further comprising: within the multi-bit pulsed latch circuit, sharing the pulse generator among the plurality of latches.

32. The method of claim 30, further comprising performing clock gating operations for the integrated circuit design within the multi-bit pulsed latch circuit.

33. The method of claim 30, further comprising stitching together the plurality of latches so that the latches are scan testable.

34. The method of claim 30, further comprising defining characterizations of a plurality of multi-bit pulsed latch circuits for the cell technology file.

35. The method of claim 34, further comprising coupling the plurality of multi-bit pulsed latch circuits in series for scan testability.

36. A computer program product for synthesizing an integrated circuit design, the computer program product comprising a computer usable medium having computer readable code physically embodied therein, said computer program product further comprising computer readable program code for:

storing in a memory device a plurality of instructions;

executing, by a processor, the plurality of instructions to provide at least one software module that includes a logic synthesizer module;

receiving, by the logic synthesizer module, a circuit description and a cell technology file;

generating, by the logic synthesizer module, functional logic of the integrated circuit design;

characterizing, within the cell technology file, a multi-bit pulsed latch circuit that functions as at least two flip flops and that includes a pulse generator for generating pulses and a plurality of latches coupled to the pulse generator; and generating, by the logic synthesizer module, the functional logic of the integrated circuit so that the multi-bit pulsed latch circuit can be used in place of the at least two flip flops that are in data paths of the circuit description.

37. The computer program product of claim 36, further comprising computer readable program code for within the multi-bit pulsed latch circuit, sharing the pulse generator among the plurality of latches.

38. The computer program product of claim 36, further comprising computer readable program code for performing clock gating operations for the integrated circuit design within the multi-bit pulsed latch circuit.

39. The computer program product of claim 36, further comprising computer readable program code for stitching together the plurality of latches so that the latches are scan testable.

40. The computer program product of claim 36, further comprising computer readable program code for defining characterizations of a plurality of multi-bit pulsed latch circuits for the cell technology file.

41. The computer program product of claim 40, further comprising computer readable program code for coupling the plurality of multi-bit pulsed latch circuits in series for scan testability.

* * * * *